United States Patent [19]

Seidensticker et al.

[11] Patent Number: 4,919,901
[45] Date of Patent: Apr. 24, 1990

[54] BARRIER DESIGN FOR CRUCIBLES FOR SILICON DENDRITIC WEB GROWTH

[75] Inventors: Raymond G. Seidensticker, Forest Hills; Edgar L. Kochka, Greentree; Charles S. Duncan, Penn Hills, all of Pa.

[73] Assignee: Westinghouse Electric Corp., Pittsburgh, Pa.

[21] Appl. No.: 140,071

[22] Filed: Dec. 31, 1987

[51] Int. Cl.$^5$ .............................................. C30B 35/00
[52] U.S. Cl. .................................. 422/249; 156/617.1; 156/620.4; 156/DIG. 88; 156/DIG. 64; 156/608; 156/609; 156/DIG. 97; 156/605; 422/245; 422/248; 51/309
[58] Field of Search ............ 51/309; 156/617.1, 620.3, 156/620.4, 605, 607, 608, 609, DIG. 64, DIG. 88, DIG. 97; 422/245, 246, 248, 249

[56] References Cited

U.S. PATENT DOCUMENTS

| | | | |
|---|---|---|---|
| 4,289,571 | 9/1981 | Jewett | 156/617 |
| 4,389,377 | 6/1983 | Duncan et al. | 156/DIG. 84 |
| 4,659,421 | 4/1987 | Jewett | 156/DIG. 64 |
| 4,698,120 | 10/1987 | Higginbotham | 156/608 |

OTHER PUBLICATIONS

Duncan, et al., Development of Processes for the Production of Low Cost Silicon Dendritic Web for Solar Cells, IEEE, (1980), 25–30.
Seidensticker and Hopkins, "Silicon Ribbon Growth by the Dendritic Web Process," Journal of Crystal Growth 50, (1980), 221–235.
Seidensticker, et al., "Computer Modeling of Dendritic Web Growth Processes and Characterization of the Material," (1978). 358–362.

Primary Examiner—Gary P. Straub
Assistant Examiner—M. Franklin

[57] ABSTRACT

This invention delineates a multiple barrier design for separating the feed compartment (12) from the growth compartment (13) in crucibles (10) used for silicon dendritic web growth. The use of the barrier design greatly reduces the thermal interaction between the two compartments permitting larger replenishment rates without adverse effect on crystal growth. Its novelty lies in having a primary and secondary barrier (15,16) spaced apart from one another such that there exists a space (22) between the barriers (15,16) which is devoid of liquid silicon thus reducing the thermal conductance of the combination.

20 Claims, 3 Drawing Sheets

BARRIER DESIGN FOR CRUCIBLES FOR SILICON DENDRITIC WEB GROWTH

FIELD OF THE INVENTION

The present invention relates to apparatus for growing silicon dendritic web crystals.

BACKGROUND OF THE INVENTION

Silicon dendritic web crystals are customarily grown from relatively small, shallow crucibles in order to obtain the temperature distribution and convective stability needed for this mode of crystal growth. As the crystal is pulled from the melt, the melt is depleted. Consequently, continuous addition of new silicon to the melt is needed to obtain extremely long crystals grown under steady state conditions. Not only must the silicon be added simply to supply silicon for long growth, but also to maintain a constant melt height which is one of the key parameters for achieving steady state growth. Moderate success in continuous growth has been achieved by the addition of small chunks of silicon (small cubes, "shot", etc.) to a feed compartment at one end of the crucible.

In the past, a single-walled barrier has been used to reduce the amount of disruptive waves and ripples occurring on the silicon melt surface as feed silicon is dropped into the melt. However, such barriers have not been particularly effective in eliminating adverse thermal interactions that occur between the feed and growth regions. The feed silicon, which is colder than the melt into which it is dropped, causes isolated pockets of cooler melt to form, increasing the danger of the silicon "freezing" on nucleation points within the growth region of the crucible, thereby seriously interfering with dendritic web crystal growth.

SUMMARY OF THE INVENTION

The present invention solves the temperature problems of melt replenishment with a specially designed barrier. A crucible is used, and has an inner surface defining a feed region and a growth region. The two regions are separated by a unique barrier which comprises a primary and a secondary barrier. The primary and secondary barriers each has a bottom and sides permitting each barrier to substantially conform to the inner surface of the crucible. The secondary barrier is separated from, and is substantially parallel to, the primary barrier, such that there exists an insulating space between the two barriers. The primary and secondary barriers each include a flow opening through which liquid silicon may flow from the feed region to the growth region of the crucible.

Other details, objects and advantages of the invention will become apparent as the following description of the presently preferred embodiments and presently preferred methods of practicing the invention proceeds.

BRIEF DESCRIPTION OF THE DRAWINGS

The invention will become more readily apparent from the following description of preferred embodiments thereof shown, by way of example only, in the accompanying drawings, wherein.

DETAILED DESCRIPTION OF THE INVENTION

Figure 1:
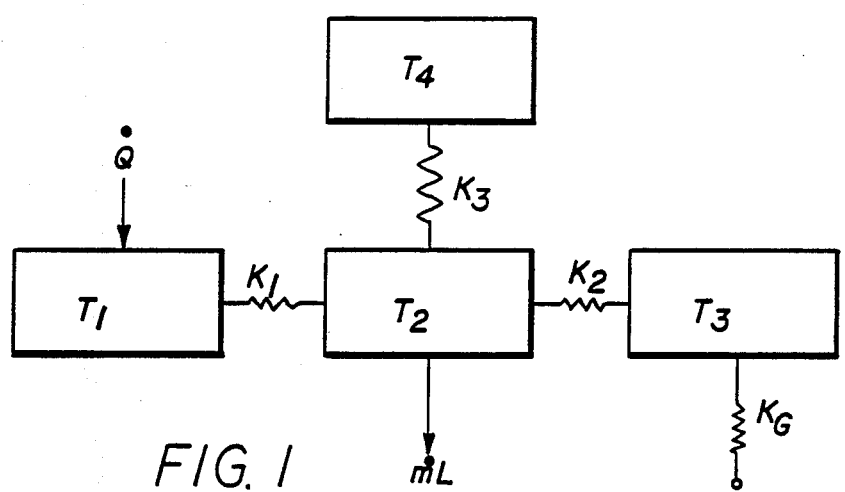
FIG. 1 is a lumped parameter thermal model for a silicon dendritic web growth system, demonstrating heat sources, sinks, and resistance to heat transfer.

One requirement for reducing thermal interaction between the feed and growth regions of the crucible is to reduce the thermal conduction between the two regions while maintaining appropriate liquid connection. This concept has recently been quantified in terms of a lumped parameter thermal model shown in FIG. 1. The parameter K2 in the model represents the thermal connection between the feed compartment and the melt. Analysis of the model yields the results that the temperature change in the growth compartment, dT3/dm is given by $$\frac{dT3}{dm} = \frac{K2}{(K2 + K_G)(K1 + K2 + K3) - K2^2} \left( K1 \frac{dT1}{dm} + K3 \frac{dT4}{dm} + L \right) \quad (1)$$

where the K's are the various thermal conductances shown in FIG. 1; $T_1$ represents the temperature of the susceptor, $T_2$ the crucible feed compartment temperature, $T_3$ the crucible growth compartment temperature, and $T_4$ the temperature of the lid covering the crucible; L is the combined latent heat and sensible heat required to melt the silicon chunk and m is the rate of adding material to the feed compartment. The important feature of this equation is that it verifies the importance of the barrier impedance, K2; as K2 becomes very small, dT3/dm also becomes very small so that the growth compartment temperature is unaffected by feeding.

Figure 2:
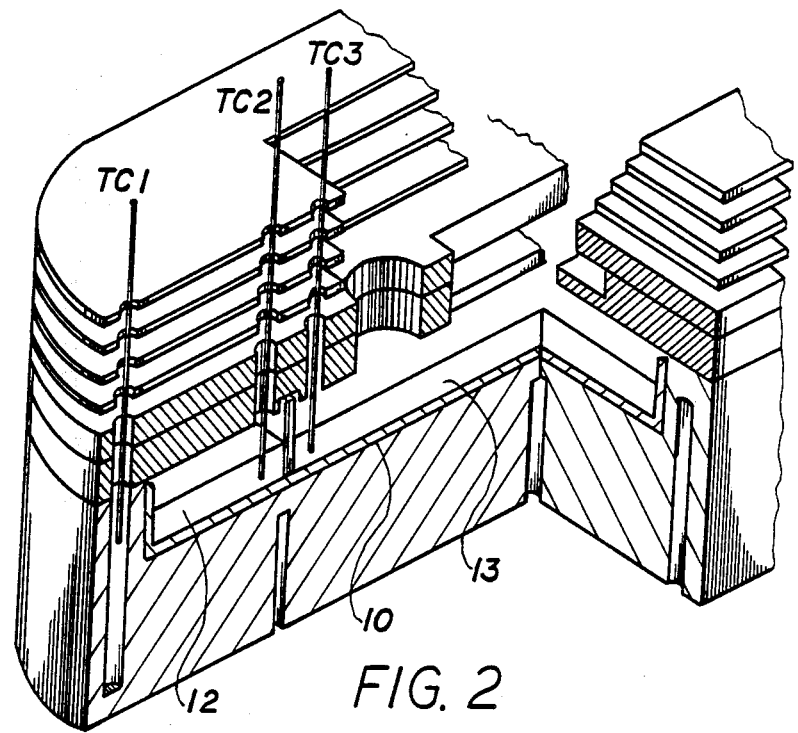
FIG. 2 is a schematic diagram of a typical dendritic web growth arrangement showing the positioning of thermocouples used for measuring temperature differentials.

The thermal conductances were evaluated by a series of experiments in which the temperatures of the end of the susceptor TC1, the feed compartment TC2 and the growth compartment TC3 were measured for a conventional dendritic web growth system using the thermocouple arrangement shown in FIG. 2. Several types of barriers as shown in FIGS. 3a–d were evaluated, and the thermal conductances calculated for several types. Table 1 indicates the area of the barrier and slot area. As predicted by Equation 1, the smaller the thermal conductance of the barrier, the less the growth compartment temperature was affected by adding replenishment material.

TABLE 1

Figure 3A:
FIGS. 3(a)–(d) are frontal views of several crucible barrier designs.
Figure 3B:
Figure 3C:
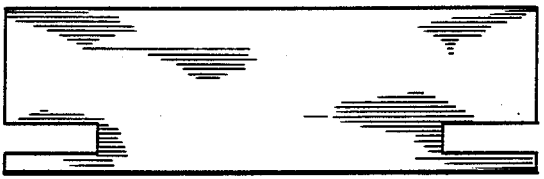
Figure 3D:

| Barrier | Total Area (cm²) @9 mm melt depth | Total Area (cm²) @7 mm melt depth | Slot Area (cm²) |
|---|---|---|---|
| FIG. 3a | 5.22 | 3.48 | 0.90 |
| FIG. 3b | 5.22 | 3.48 | 0.58 |
| FIG. 3c | 5.22 | 3.48 | 0.90 |
| FIG. 3d | 5.22 | 3.48 | 0.61 |

The present invention uses a crucible having a barrier comprising a first or primary barrier and a second (or secondary) barrier of the proper design located approximately parallel to the primary barrier in the crucible. It has been determined that the design and placement of the secondary barrier is critical for obtaining optimum reduction of the thermal impedance of the combination.

Figure 4:
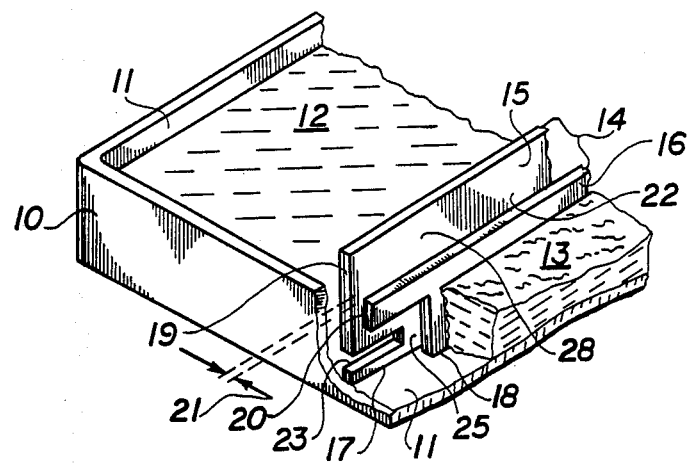
FIG. 4 is a schematic representation of the design and placement of the primary and secondary barriers of one preferred embodiment of the present invention.

A preferred embodiment of the present invention is shown in FIG. 4. A crucible 10 for growing silicon dendritic web crystals has an inner surface 11 defining a feed region 12 and a growth region 13. The double-walled barrier, generally 14, separates the feed region 12 from the growth region 13. The barrier 14 comprises a primary barrier 15 and a secondary barrier 16. As shown, the primary and secondary barrier each has a bottom, 17, and 18, respectively, and sides 19 and 20, respectively, which permit the primary and secondary barriers to substantially conform to the inner surface 11 of the crucible 10.

The primary barrier should be of the end slotted type, as shown in FIGS. 3b-d. Thermal measurements show that these barriers have a thermal conductance of about 1.0 W/deg compared with about 5.3 W/deg of the type shown in FIG. 3a. Assuming such a configuration for the primary barrier, the secondary barrier presently proposed would have a configuration as shown in FIG. 4, namely a solid fused quartz plate of thickness 2 to 3 mm with openings large enough so that the liquid silicon can readily reach and penetrate the openings in the primary barrier. The secondary barrier should be separated from the primary barrier by a spacing of 0.5 to 1.5 mm (0.020" to 0.060").

Figure 5:
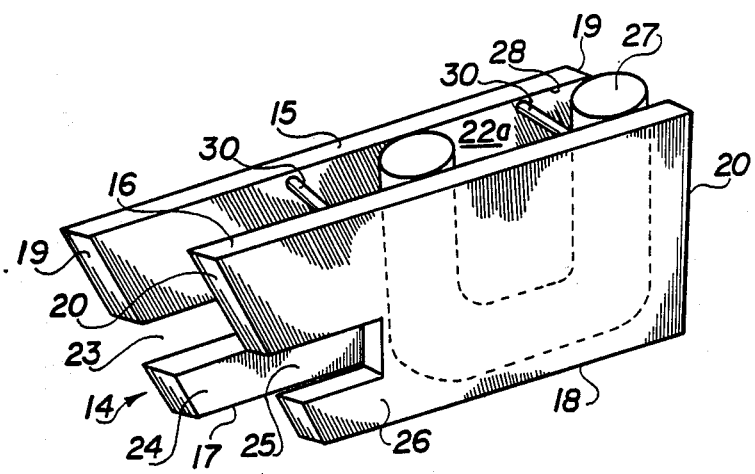
FIG. 5 is an isometric view of one embodiment of the barrier used according to the present invention.

As shown in FIGS. 4 and 5, the secondary barrier 16 is separated from, and substantially parallel to, the primary barrier 15. This separation 21 preferably creates an insulating space 22 between the primary barrier 15 and secondary barrier 16. The primary barrier 15 and secondary barrier 16 are preferably tacked to the inner surface 11 of the crucible 10, as by spot welding.

Also shown in FIGS. 4 and 5 are preferred configurations of the windows or flow openings in the barriers. The primary barrier 15 preferably has an end slot or flow opening 23, through which liquid silicon may flow from the feed compartment 12 to the growth compartment 13. The flow opening 23 is preferably positioned in the primary barrier 15 such that there remains a footer portion 24 of the primary barrier 15 directly below the flow opening 23. Similarly, the secondary barrier 16 preferably has an end slot or flow opening 25, through which liquid silicon may flow from the feed region 12 to the growth region 13. As shown in FIG. 5, the secondary barrier flow opening 25 preferably is also positioned such that there remains a footer portion 26 directly below the flow opening 25.

As shown in FIG. 5, the insulating space 22 may comprise a gas space 22a formed and maintained by a substantially u-shaped reinforcing member 27, which member is fused to the primary and secondary barriers, 15 and 16, thereby creating a seal around the bottom 17, 18 and sides 19, 20 of the barriers 15 and 16 respectively. The gas space is open to the atmosphere at the top 28 of the barrier 14. The u-shaped member is preferably a quartz rod, which is heat fused to the barriers 15 and 16, which preferably are also quartz. The seal thus produced around the u-shaped member prevents molten silicon from invading the gas space 22a. Alternatively, the insulating space 22 may be filled with an insulating material, such as refractory fibers. Also, the insulating space need not be defined by a u-shaped member. For example, the space 22 could be formed by fusing the bottoms 17 and 18 of the primary and secondary barriers to the bottom inside surface 11 of the crucible 10, and fusing an end member at either end of the primary and secondary barriers, with one end member being positioned between the other end member and the flow openings 23 and 25, thereby connecting the primary and secondary barriers together to form the insulating space 22, while permitting molten silicon to flow from the feed compartment 12 to the growth compartment 13 through the flow openings 23 and 25.

Also as shown in FIGS. 4 and 5, it is preferable that the flow openings 23 and 25 be aligned with each other, although this is not absolutely necessary. Although the barriers may include flow openings on either end, as shown in FIGS. 3b-d, the flow openings may also be positioned on only one end of the barriers as shown in FIG. 5. As further shown in FIG. 5, the barrier 14 may include one or more reinforcing rods 30, positioned between the primary and secondary barriers 15 and 16 to minimize the tendency of the softened quartz barriers to buckle inward upon heating. The barrier 14 shown in FIG. 5 has sloped sides, 19 and 20, to enable the barrier to substantially conform to the inner surface 11 of a sloped-wall crucible, disclosed in copending application Ser. No. 07/012,779.

The requirements on the secondary barrier design are based on the thermal conduction properties of fused quartz and observations on the wetting properties of silicon. Since fused quartz is essentially transparent to wavelengths less than 3.8 $\mu$m, a great deal of energy can be transmitted by radiation compared to lattice conductivity, especially at high temperatures. However when both surfaces of a fused quartz slab are in intimate contact with a low emissivity material such as liquid silicon ($\epsilon=0.2$) the radiation transfer is much reduced and the lattice conduction dominates. Thus two quartz barriers separated by a layer of liquid silicon would have a thermal conductance about the same as a single barrier with the combined thickness of the two individual quartz plates. However if the barriers are separated by a gas, then there is an additional thermal impedance from the gas conductivity. Additionally, however, there is radiation transfer between the quartz plates at those wavelengths for which the quartz is not transparent. Balancing the effect of gas conduction and radiative transfer suggests that the separation of the primary and secondary barriers should be at least 0.5 mm (0.020") but that separations of more than 2.0 mm (0.080") produce minimal improvement. Hence a reasonable barrier separation lies between these extremes, and preferably between 0.5 and 1.5 mm, using 2 mm thick quartz plates for the barriers.

The wetting behavior of liquid silicon influences the design of the flow openings, or windows, in the secondary barrier. These windows must be large enough that the liquid silicon will reach the penetrations in the primary barrier and establish a stable, continuous liquid connection between the feed compartment and the growth compartment. Based on experience, the window 25 in the secondary barrier is preferably at least 2 mm larger in height than the window 23 in the primary barrier.

It would be conceptually possible to use a configuration having more than one secondary barrier 16 and such configurations lie within the scope of this proposed invention. From a practical consideration, however, an end-slotted primary barrier 15 and a single secondary barrier 16 will produce enough thermal isolation for most feeding rates. The end slotted barrier reduced the conductance K2 by a factor of five relative to a center slotted barrier (FIG. 3a). The use of a secondary barrier should reduce the conductance by a factor of at least five over the single end slotted barrier.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

We claim:

1. A crucible for growing silicon dendritic web crystals, said crucible including a feed region and a growth region, said crucible further including a barrier separating said feed region from said growth region, said barrier comprising a primary and a secondary barrier, said secondary barrier being separated from, and substantially parallel to, said primary barrier, said primary and secondary barriers each including a flow opening through which liquid silicon may flow from said feed region to said growth region.

2. The crucible of claim 1 in which there exists an insulating gas space between said primary and said secondary barriers.

3. The crucible of claim 1 in which said primary and secondary barriers are separated by a distance of 0.5–2.0 mm.

4. The crucible of claim 2 in which the insulating gas space is formed and maintained by a substantially u-shaped reinforcing member which is fused to said primary and secondary barriers, thereby creating a seal between said barriers.

5. The crucible of claim 4 in which said u-shaped reinforcing member comprises a quartz rod.

6. The crucible of claim 2 in which the insulating gas space is formed and maintained by sealing the bottoms of said primary and secondary barriers to said crucible and fusing an end member at either end of said primary and secondary barriers, with one said end member being positioned between the other end member and the barrier flow openings, thereby connecting said primary and secondary barriers together to form said insulating gas space.

7. The crucible of claim 2 in which each said flow opening in said primary and secondary barriers is positioned such that there remains a footer portion of said primary and secondary barrier directly below each said flow opening.

8. The crucible of claim 2 in which said flow openings in said primary and said secondary barriers are substantially aligned with each other.

9. The crucible of claim 2 in which said barrier is tacked to said crucible.

10. A crucible for growing silicon dendritic web crystals, said crucible having an inner surface defining a feed region and a growth region, said crucible further including a barrier separating said feed region from said growth region, said barrier comprising a primary and a secondary barrier, each said primary and secondary barrier having a bottom and sides permitting each said barrier to substantially conform to the inner surface of said crucible, said secondary barrier being separated from, and substantially parallel to, said primary barrier, such that there exists an insulating space therebetween, said primary and secondary barriers each including a flow opening through which liquid silicon may flow from said feed region to said growth region, each said flow opening being positioned such that there remains a footer portion of said primary and secondary barrier directly below each said flow opening.

11. The crucible of claim 10 in which said insulating space comprises a gas space formed by a substantially u-shaped reinforcing member which is fused to said primary and secondary barriers, thereby creating a seal around the bottom and sides of said barriers.

12. The crucible of claim 10 in which said insulating space is substantially filled with an fibrous insulating material.

13. The crucible of claim 10 in which said primary and secondary barriers are separated by a distance of 0.5–1.5 mm.

14. The crucible of claim 10 in which the insulating gas space is formed and maintained by sealing the bottoms of said primary and secondary barriers to said crucible inner surface and fusing an end member at either end of said primary and secondary barriers, with one said end member being positioned between the other end member and the barrier flow openings, thereby connecting said primary and secondary barriers together to form said insulating gas space.

15. The crucible of claim 11 in which said u-shaped reinforcing member comprises a quartz rod.

16. The crucible of claim 10 in which said flow openings in said primary and said secondary barriers are aligned with each other.

17. The crucible of claim 10 in which said barrier is tacked to said crucible.

18. The crucible of claim 10 in which said secondary barrier flow opening is at least 2 mm larger in height than the primary barrier flow opening.

19. The crucible of claim 10 in which said primary and secondary barriers comprise quartz barriers 2 mm thick.

20. The crucible of claim 10 in which said primary and secondary barriers include at least one reinforcing rod positioned between the primary and secondary barriers.

* * * * *